(12) United States Patent
Geens et al.

(10) Patent No.: US 12,213,265 B2
(45) Date of Patent: Jan. 28, 2025

(54) MANAGING NETWORK INSTALLATION

(71) Applicant: COMMSCOPE TECHNOLOGIES LLC, Hickory, NC (US)

(72) Inventors: Johan Geens, Bunsbeek (BE); Kristof Vastmans, Kessel-Lo (BE)

(73) Assignee: CommScope Technologies LLC, Hickory, NC (US)

( * ) Notice: Subject to any disclaimer, the term of this patent is extended or adjusted under 35 U.S.C. 154(b) by 237 days.

(21) Appl. No.: 17/794,553

(22) PCT Filed: Jan. 20, 2021

(86) PCT No.: PCT/US2021/014181
§ 371 (c)(1),
(2) Date: Jul. 21, 2022

(87) PCT Pub. No.: WO2021/150608
PCT Pub. Date: Jul. 29, 2021

(65) Prior Publication Data
US 2023/0070605 A1 Mar. 9, 2023

Related U.S. Application Data

(60) Provisional application No. 62/963,916, filed on Jan. 21, 2020.

(51) Int. Cl.
*B60R 1/12* (2006.01)
*G02B 6/46* (2006.01)
(Continued)

(52) U.S. Cl.
CPC ............. *H05K 5/0204* (2013.01); *G02B 6/46* (2013.01); *H02G 3/24* (2013.01); *H02G 3/32* (2013.01); *H02G 2200/20* (2013.01)

(58) Field of Classification Search
USPC ...... 340/815.4, 870.02, 825.49, 286.02, 309, 340/815.47, 815.48, 815.6
See application file for complete search history.

(56) References Cited

U.S. PATENT DOCUMENTS 5,702,298 A * 12/1997 Conkling .............. F24F 13/142
454/324
7,315,887 B1  1/2008 Liang et al.
(Continued)

FOREIGN PATENT DOCUMENTS

EP          2 594 976 A1   5/2013
KR   10-2014-0102182 A    8/2014
(Continued)

OTHER PUBLICATIONS

Extended European Search Report for Application No. 21744658.2 mailed Jan. 31, 2024.
(Continued)

*Primary Examiner* — Daniel Previl
(74) *Attorney, Agent, or Firm* — Merchant & Gould P.C.

(57) ABSTRACT

A mounting bracket may reserve an installation site for a network component at a specific geographic location. The mounting bracket may bear indicia by which the mounting bracket can be associated (e.g., electronically) with the geographic location for tracking and/or reporting purposes. The indicia may be removable from the mounting bracket. The indicia may block the network component from being installed at the mounting bracket prior to removal of the indicia.

19 Claims, 10 Drawing Sheets

(51) Int. Cl.
  *H02G 3/30* (2006.01)
  *H02G 3/32* (2006.01)
  *H05K 5/02* (2006.01)

(56) References Cited

U.S. PATENT DOCUMENTS

| | | | | |
|---|---|---|---|---|
| 11,318,901 | B2* | 5/2022 | Gutierrez | B60Q 1/0408 |
| 2003/0163399 | A1* | 8/2003 | Harper | G06Q 10/10 |
| | | | | 705/35 |
| 2005/0052288 | A1* | 3/2005 | Osterloh | G06Q 50/06 |
| | | | | 340/870.02 |
| 2008/0266206 | A1* | 10/2008 | Nelson | G09F 9/3026 |
| | | | | 345/1.3 |
| 2009/0324187 | A1* | 12/2009 | Wakileh | G02B 6/44526 |
| | | | | 385/135 |
| 2010/0197222 | A1* | 8/2010 | Scheucher | H01Q 19/30 |
| | | | | 455/11.1 |
| 2016/0074918 | A1* | 3/2016 | Latoria | B21D 7/063 |
| | | | | 72/219 |
| 2016/0309606 | A1 | 10/2016 | Anderson et al. | |
| 2016/0341437 | A1* | 11/2016 | Matsuoka | F24F 11/64 |
| 2017/0121155 | A1* | 5/2017 | Westergaard | F03D 1/0691 |
| 2018/0074275 | A1* | 3/2018 | Thompson | G02B 6/4454 |
| 2019/0369345 | A1 | 12/2019 | Reagan et al. | |
| 2020/0014685 | A1 | 1/2020 | Hardy et al. | |
| 2020/0187694 | A1* | 6/2020 | Santangeli | G07F 17/12 |
| 2020/0378553 | A1* | 12/2020 | Oh | H02G 3/125 |

FOREIGN PATENT DOCUMENTS

| | | |
|---|---|---|
| WO | 2016/128083 A1 | 8/2016 |
| WO | 2019/191699 A1 | 10/2019 |
| WO | 2019/209645 A1 | 10/2019 |
| WO | 2021/092177 A1 | 5/2021 |

OTHER PUBLICATIONS

Glasdraad, "Hoe werkt de aanleg van glasvezel tot in uw woning," https://www.youtube.com/watch?v=J25r-4hdwdk, 2 pages (Feb. 11, 2019).

Glasvezel NTU plaatsen (eerste video), https://www.youtube.com/watch?v=QAeJXS6qx1o, 2 pages (Jul. 18, 2017).

Glasvezel NTU plaatsen (tweede video)—YouTube, https://www.youtube.com/shorts/5ohl43TBGX0, 2 pages (Dec. 26, 2017).

International Search Report and Written Opinion of the International Searching Authority for International Patent Application No. PCT/US2021/014181 mailed May 11, 2021, 11 pages.

* cited by examiner

MANAGING NETWORK INSTALLATION

CROSS-REFERENCE TO RELATED APPLICATION

This application is being filed on Jan. 20, 2021 as a PCT International Patent Application and a National Stage Application of PCT/US2021/014181, filed on Jan. 20, 2021, which claims the benefit of U.S. Patent Application Ser. No. 62/963,916, filed on Jan. 21, 2020, the disclosure disclosures of which are incorporated herein by reference in its entirety their entireties. To the extent appropriate, a claim of priority is made to each of the above disclosed applications.

BACKGROUND

Fiber optic connectivity and service is being extended to more and more customers, both commercial and residential. However, not all customers to whom this service is available are currently ready to accept and utilize such service. Accordingly, network cabling may be routed during an initial installation while more expensive network components (e.g., communications enclosures and/or terminals) may be subsequently installed to reduce initial capital investment. However, real estate (e.g., wall space, pole space, etc.) to which these components can be mounted may be claimed by other network providers, utility providers, or others in the interim, thereby complicating the eventual installation of the components and expansion/completion of the network.

Improvements are desired.

SUMMARY

Some aspects of the disclosure are directed to an installation process for a network component including reserving an installation site for the network component at a specific geographic location by installing a mounting bracket; and subsequently installing the component at the mounting bracket. The network component is installed at the mounting bracket on a different date from the installation of the mounting bracket at the installation site.

Other aspects of the disclosure are directed to a mounting bracket carrying an indicator member that identifies the mounting bracket, the network component or component type to be installed at the mounting bracket, and/or the geographic location of the installation site. In various examples, the indicator member may bear the information in print form, may bear a barcode (e.g., line barcode, QR code, etc.) linking to an electronic site (e.g., a webpage) storing the information, or may electronically store the information on a memory chip (e.g., an RFID tag).

In certain implementations, the indicator member may cover or otherwise block access to a securement arrangement of the mounting bracket. Accordingly, the indicator member may block installation of a network component on the mounting bracket until the indicator member is removed from the mounting bracket. In certain examples, the indicator member may be transferred from the mounting bracket to the installed network component.

In certain implementations, a user may read the indicia or otherwise obtain information from the indicator member prior to or immediately after installing the network component at the mounting bracket. For example, a user may capture the information on the indicator member prior to removing the indicator member from the mounting bracket. This captured information may be compared to information obtained from (or known about) the network component to confirm a correct match between the mounting bracket and the network component. Alternatively, a user may capture the information on the indicator member after installing the indicator member onto the network component installed at the mounting bracket, thereby associating the network component (or type of network component) with the installation site (e.g., the geographic location of the installation site).

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

The present disclosure is directed to managing installation of a communications network (e.g., a telecommunications network). The communications network is designed to include multiple network terminals (e.g., multi-service terminals, fiber indexing terminals, optical termination equipment, network interface devices, etc.) at various points along the network. During the installation process, terminal installation sites can be reserved at specific geographic locations (e.g., a telephone pole, a specific spot on a wall, etc.) by installing a mounting bracket for the terminal. The terminal itself can be installed at the mounting bracket at a subsequent date (e.g., after service is requested for that location).

Allowing terminal installation sites to be reserved allows the communications network to be designed and implemented within a geographic area in a structured and logical way even if service has not yet been requested throughout the entire area. Be reserving space, the network provider is assured that the network terminals can subsequently be installed as planned instead of needing to redesign the network to match available space at the subsequent date each time service is requested.

Figure 1:
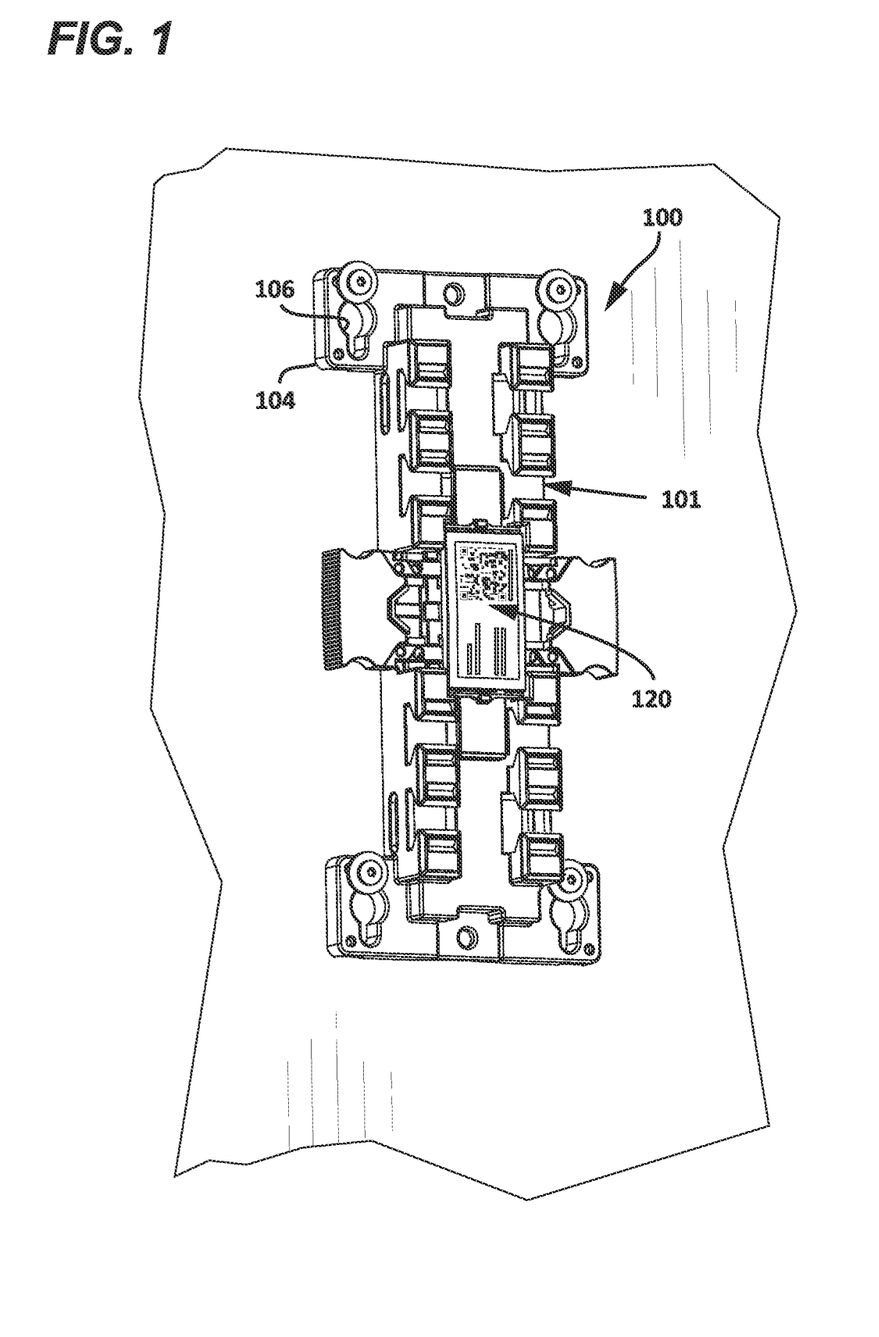
FIG. 1 is a perspective view of an example mounting bracket installed on a wall, the mounting bracket carrying an example indicator member.

FIG. 1 illustrates an example mounting bracket 100 installed at a first installation site. In the example shown, the mounting bracket 100 is installed on a wall. In other examples, the mounting bracket 100 can be pole-mounted, aerial mounted, and/or mounted below ground. The mounting bracket 100 is installed on a first date of the network installation. For convenience, this first date will be referred to herein as "day one." However, the term "day one" is used for convenience only and does not imply that the mounting bracket must be installed on the earliest day of the network installation.

The mounting bracket 100 includes a frame 102 defining a front 101 and an opposite rear 103. The rear 103 of the bracket frame 102 contacts the wall or other mounting surface when installed. The front 101 of the bracket frame 102 is accessible when the mounting bracket 100 is installed. In some implementations, the mounting bracket 100 is secured to the wall using fasteners (e.g., rivets, bolts, zip ties, screws, or other such structures). For example, fasteners can be inserted through openings 106 defined is tabs 104 extending from the frame 102. In other implementations, the ear 103 of the mounting bracket 100 is secured to the mounting surface using adhesive, latches, a friction-fit, or using another securement technique. In certain examples, the mounting bracket 100 is not easily removable from the mounting location (e.g., is not removable without tools).

Figure 2:
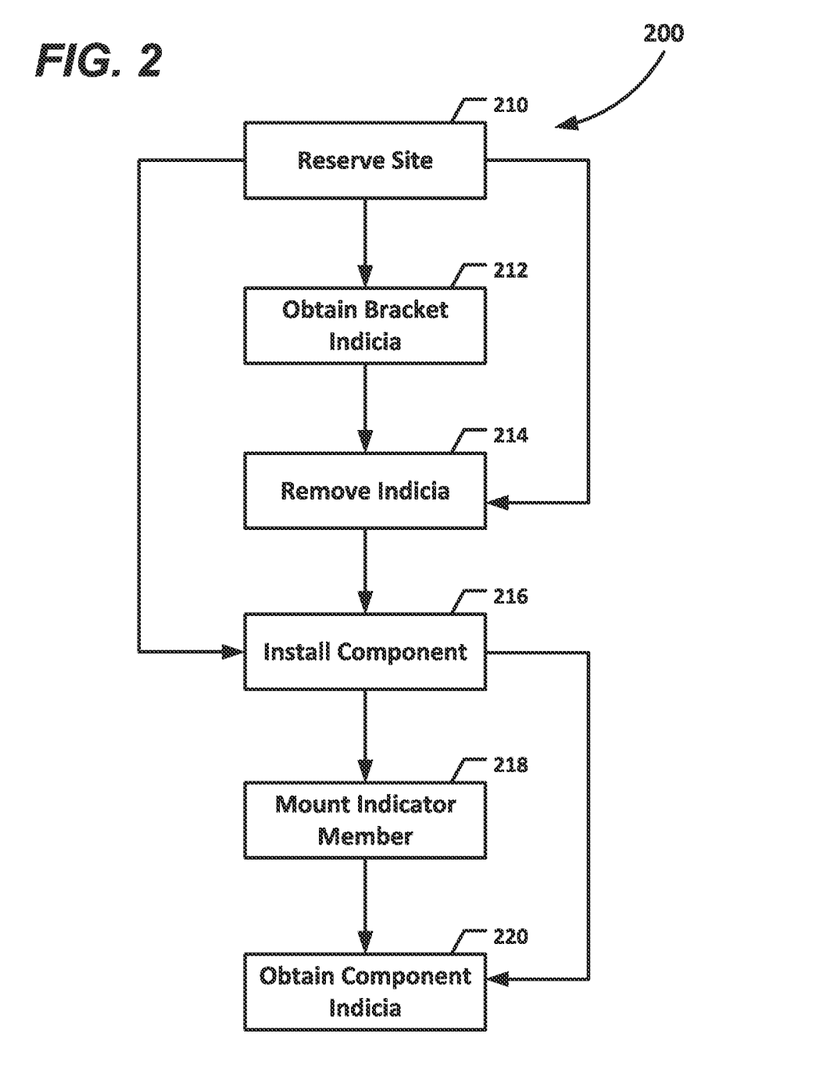
FIG. 2 is a flow chart illustrating an example installation process by which a component can be secured to the mounting bracket of FIG. 1.

FIG. 2 illustrate an installation process 200 by which the network may be installed. The installation process 200 includes reserving a terminal installation site as a first step 210. As shown in FIG. 1, the termination installation site is reserved by installing the mounting bracket 100 at the installation site to be reserved. Accordingly, other equipment (e.g., from other utility companies) or other structures (e.g., signs, decorations, etc.) cannot be mounted at the installation site prior to installation of the terminal itself.

Figure 3:
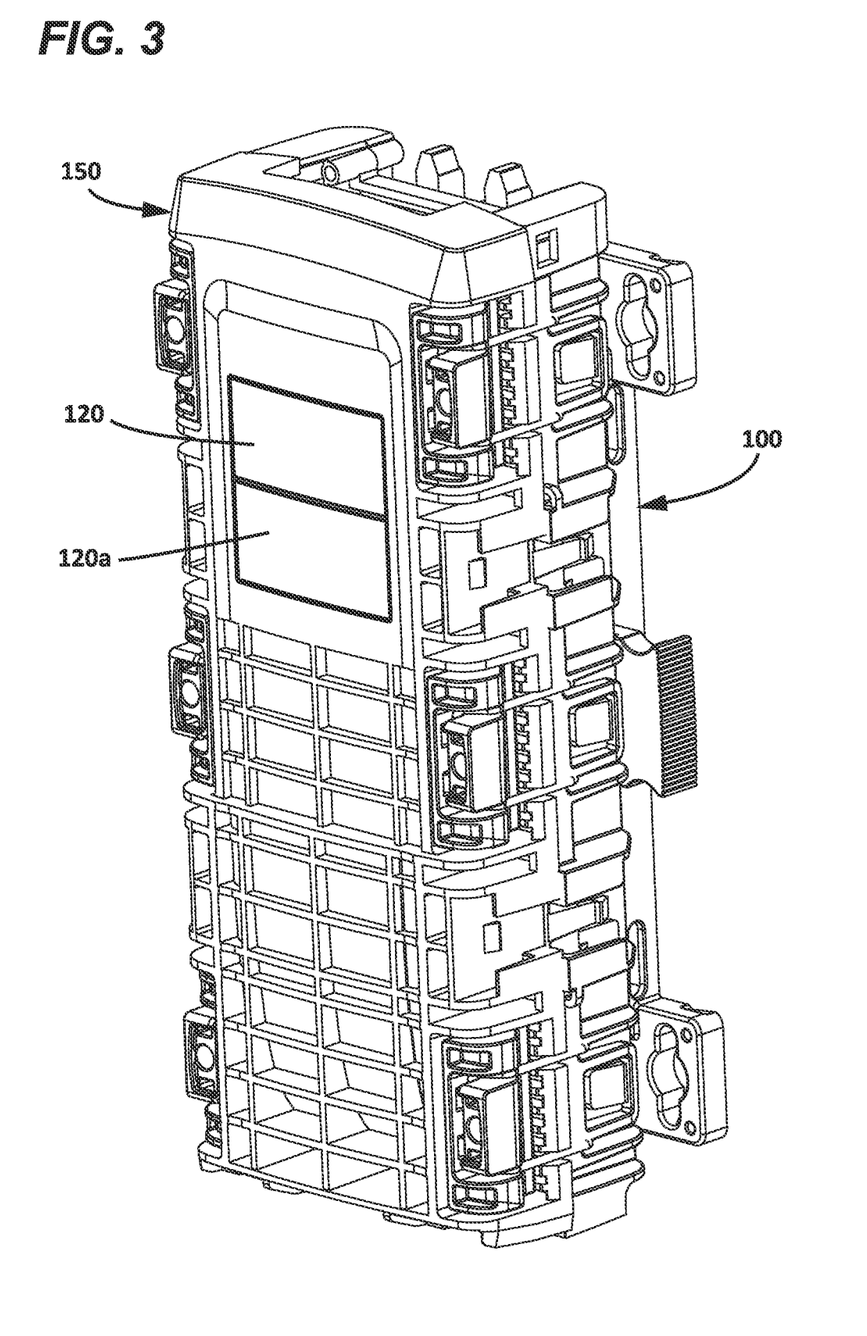
FIG. 3 shows an example component installed at the mounting bracket of FIG. 1.

In certain implementations, the installation process 200 proceeds to installing the terminal or other component 150 at the next step 216. The install step 216 occurs on a different date (e.g., one or more days later, one or more weeks later, one or more months later, one or more years later) than the reserve step 210. FIG. 3 illustrates an example component 150 installed at the mounting bracket 100. In some implementations, the component 150 can be latched to the bracket 100. In other implementations, the component 150 can be fastened to the bracket 100 using screws, zip ties, or other fasteners.

Figure 4:
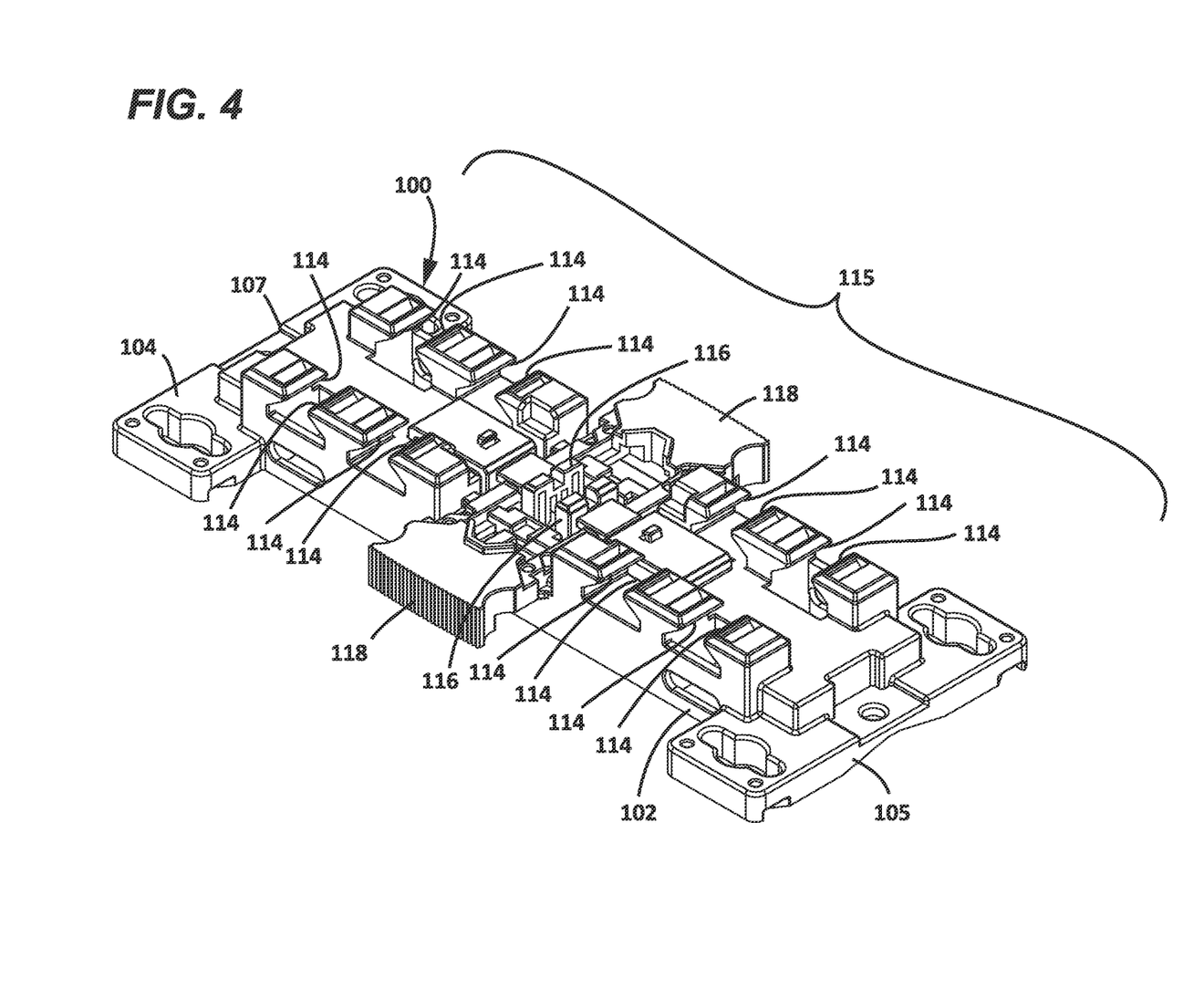
FIG. 4 is a front perspective view of the example mounting bracket of FIG. 1 with the indicator member removed to expose a securement arrangement of the mounting bracket.

In accordance with certain aspects of the disclosure, the component 150 can be releasably locked to the bracket 100. FIG. 4 illustrates one example securement arrangement 115 by which the component 150 can be attached to the bracket 100. As shown in FIG. 4, the securement arrangement 115 is accessible from the front 101 of the mounting bracket 100. The securement arrangement 115 includes one or more stationary hooks 114 and a movable stop member 116. The stop member 116 is movable via one or more actuators 118 between a retracted position and an extended position.

Figure 5:
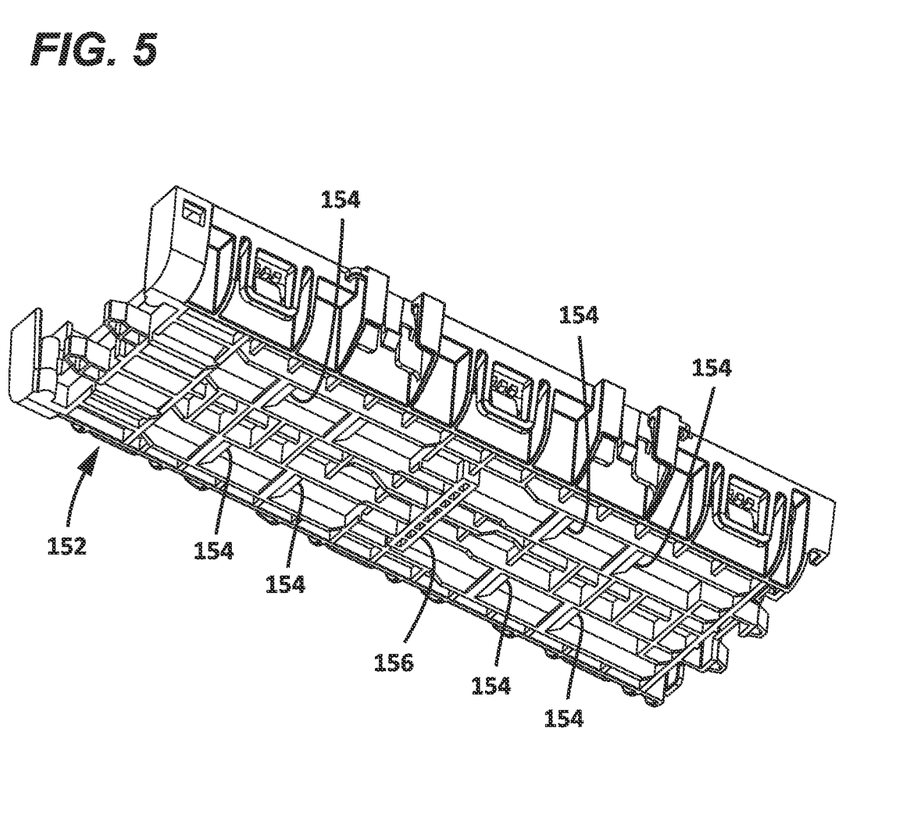
FIG. 5 is a rear perspective view of a portion (e.g., a base) of the component of FIG. 3 showing mounting structure that engages the securement arrangement of FIG. 4.

As shown in FIG. 5, a rear 152 of the component 150 defines one or more catch surfaces 154 and a mounting member 156. The component 150 is mounted to the bracket 100 when the stop member 116 is disposed in the retracted position. When the component 150 is mounted to the bracket 100, the catch surfaces 154 of the component 150 engage the hooks 114 of the bracket 100 to retain the component 150 against movement relative to the bracket 100 in a first direction. The stop member 116 is moved to the extended position to engage the mounting member 156 of the component 150, thereby inhibiting movement of the component 150 relative to the bracket 100 in the opposite, section direction. Inhibiting movement in the second direction prevents the catch surfaces 154 from disengaging the hooks 114. Accordingly, in certain examples, the component 150 is removed from the bracket 100 by first moving the stop member 116 to the retracted position, thereby allowing the component 150 to be moved in the second direction.

In certain implementations, component 150 can be selectively mounted to the bracket 100 from either of two opposite ends of the bracket 100. For example, the mounting bracket 100 may include a first set of one or more hooks 114 facing towards a first end 105 of the bracket 100 and a second set of one or more hooks 114 facing towards a second end 107 of the bracket 100. Accordingly, the first set of hooks 114 engage the catch surfaces 154 of the component 150 when the component 150 is slid relative to the bracket from the first end 105 of the bracket 100 (see arrow F1 in FIG. 6). When installed along arrow F1, the stop member 116 engages a first end of the mounting member 156. The second set of hooks 114 engage the catch surfaces 154 when the component 150 is slid relative to the bracket 100 from the second end 107 of the bracket 100 (see arrow F2 in FIG. 6). When installed along arrow F2, the stop member 116 engages a second end of the mounting member 156.

In certain implementations, the one or more actuators 118 are configured to move in a direction transverse to the movement of the stop member 116 between retracted and extended positions. In certain implementations, the one or more actuators 118 are configured to move in a direction transverse to the movement of the component 150 when mounted to the bracket 100. In certain implementations, when moving between retracted and extended positions, the stop member 116 moves in a direction transverse to the movement of the component 150 being mounted to the bracket 100. In certain implementations, the one or more actuators 118 include first and second actuators 118 disposed at opposite sides of the bracket frame 102. In certain examples, actuating either of the actuators 118 moves the stop member 116.

More details pertaining to the securement arrangement 115 and other examples of suitable securement arrangements are described in U.S. Provisional Application No. 62/963, 893, filed Jan. 21, 2020, and titled "Telecommunications Enclosure Mounting System," the disclosure of which is hereby incorporated by reference in its entirety.

In some implementations, cabling for the terminal or other component 150 can be routed during the initial installation of the mounting brackets (e.g., during the first step 210). Reserving the installation site allows the cables to be laid once without the need to reconfigure later. The installation site cannot be usurped requiring a rerouting of the cables. In other implementations, cabling for the component 150 can be routed when the component 150 is installed. Delaying the routing to step 216 reduces capital expenditure before service is needed. Further, because the mounting location is known ahead of time, the network provider will know exactly how much cable is needed to install the terminal prior to arriving at the installation area, thereby reducing expenses and installation time.

Referring back to FIG. 1, the mounting bracket 100 may include a label or other indicator member 120. The indicator member 120 includes indicia that uniquely identifies the mounting bracket 100 (e.g., a bracket serial number). In certain implementations, the indicator member 120 bears the indicia in print form (e.g., a serial number, a barcode, a QR code, etc.). In certain implementations, the indicator member 120 electronically stores the indicia (e.g., on memory) in a manner that can be read by a scanner (e.g., using RFID technology). In certain examples, additional information can be written or otherwise provided to the indicator member 120 after deployment. For example, additional information can be saved to an electronic memory of the indicator member 120 or can be associated with a link referenced by the QR code.

In certain implementations, the indicator member 120 includes information in addition to the mounting bracket identifier. In various examples, the indicator member 120 includes provider information, manufacturer information, geographic information, component compatibility information, bracket specifications, and/or customer data. In certain examples, some or all of the additional information can be provided in print form. In certain examples, some or all of the additional information can be provided in electronic form.

Figure 6:
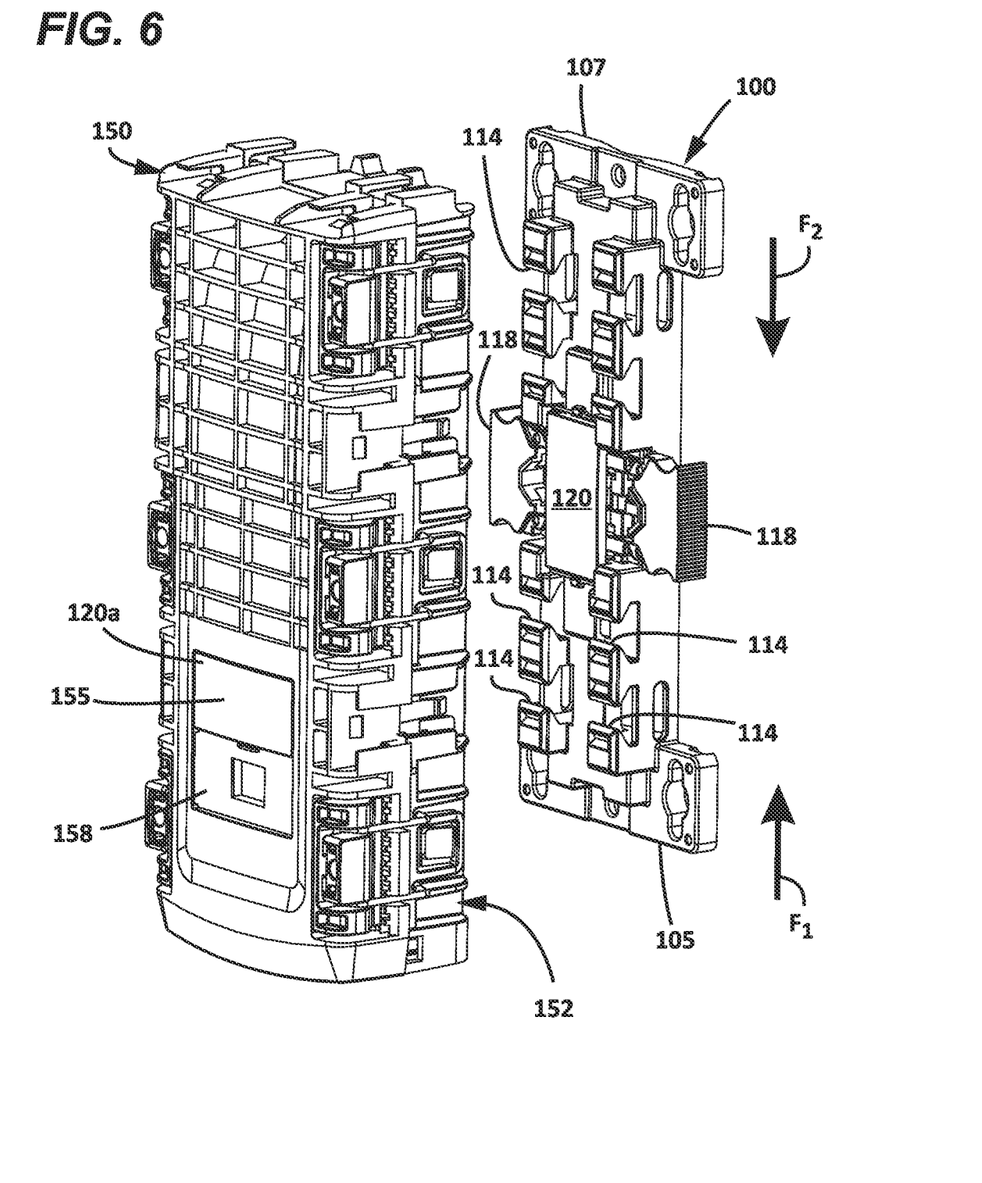
FIG. 6 shows the component of FIG. 3 exploded forwardly of the mounting bracket.

In some implementations, the component 150 may have its own indicator member 120a bearing indicia 155 (e.g., see FIG. 6). In certain implementations, the indicia (e.g., the bracket identifier) carried by the indicator member 120 of the mounting bracket 100 can be compared to the indicia 155 carried by the component 150 during the component installation step 216 to confirm that the correct component 150 (or at least the correct type of component 150) is being installed at the mounting bracket 100.

Figure 7:
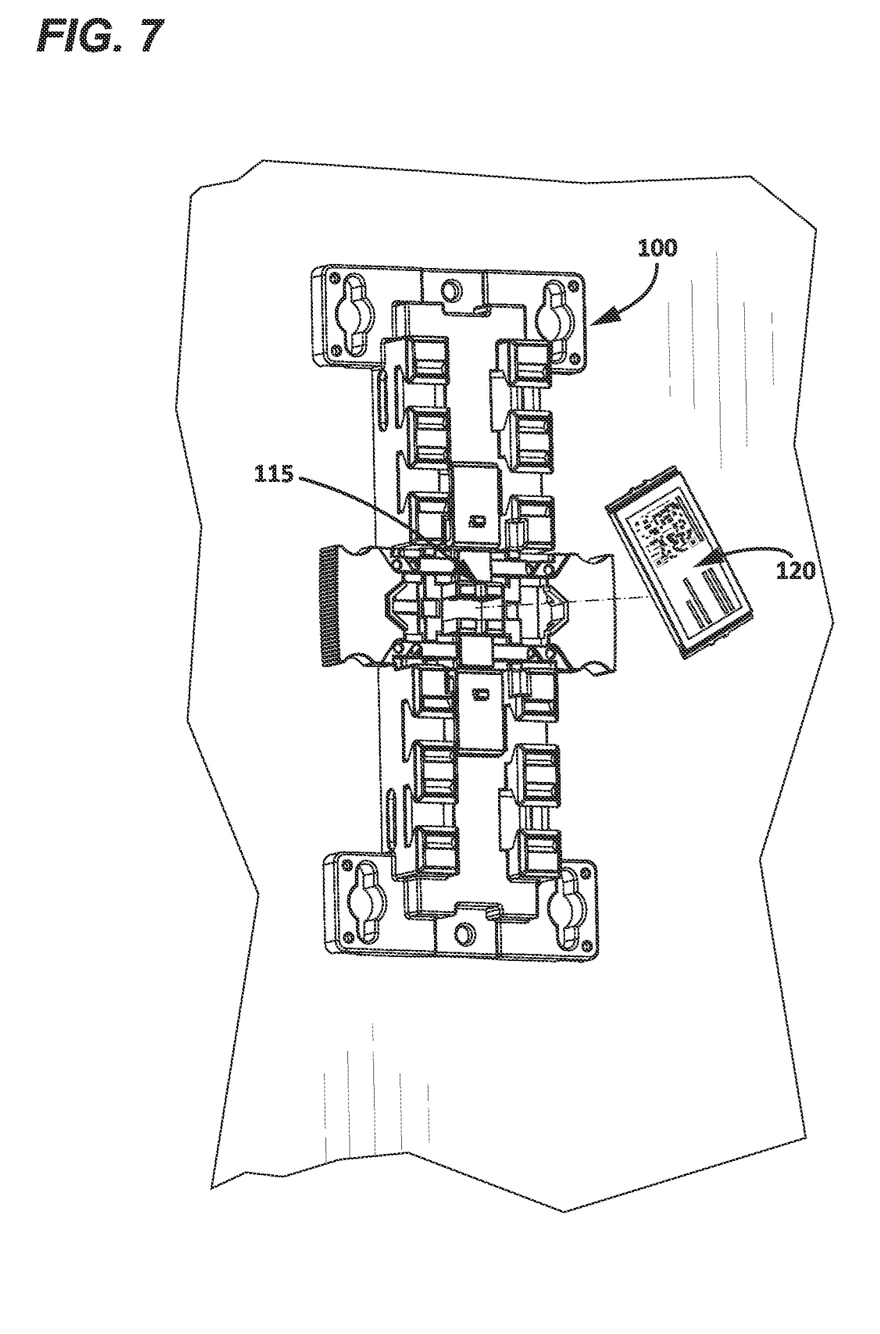
FIG. 7 is a perspective view of the mounting bracket of FIG. 1 showing the indicator member being removed from the mounting bracket.

Referring back to FIG. 2, certain instances of the installation process 200 may include one or more additional steps. For example, the installation process 200 may include removing the indicator member 120 from the mounting bracket 100 at a remove step 214 (e.g., see FIG. 7). In certain implementations, the remove step 214 is performed as part of the install step 216. In certain examples, the indicator member 120 is removed from the bracket 100 prior (e.g., immediately prior) to installing the terminal or other component 150 at the mounting bracket 100.

In some implementations, the indicator member 120 is discarded, recycled, or otherwise removed from the installation site. In other implementations, the indicator member 120 is mounted to the component 150 after the component 150 is installed at the mounting bracket 100. For example, FIG. 6 shows an example component 150 carrying a first indicator member 120a bearing component indicia 155 and a mounting station 158 sized to receive the indicator member 120 of the mounting bracket 100. FIG. 3 shows both indicator members 120, 120a mounted to the component 150. In other examples, the component 150 may not have its own indicator member, but rather utilizes the bracket indicator member 120 after installation for identification. For example, indicia (e.g., a QR code, electronic memory, etc.) on the bracket indicator member 120 can be updated to include an association with the component 150 or component type 150. Accordingly, a user may record the use of a specific component or component type at a specific geographic location. In still other implementations, the indicator member 120 is reattached to the mounting bracket 100.

In certain implementations, the indicator member 120 inhibits mounting the component 150 until the indicator member 120 is removed from the mounting bracket 100. In certain examples, the indicator member 120 may cover at least part of the securement arrangement 115 by which the component 150 is fixed to the mounting bracket 100. In the example shown in FIG. 6, the indicator member 120 may cover the stop member 116 of the securement arrangement 115. In such examples, the indicator member 120 is removed from the bracket 100 to provide access to the securement arrangement 115 by the component 120.

Figure 8:
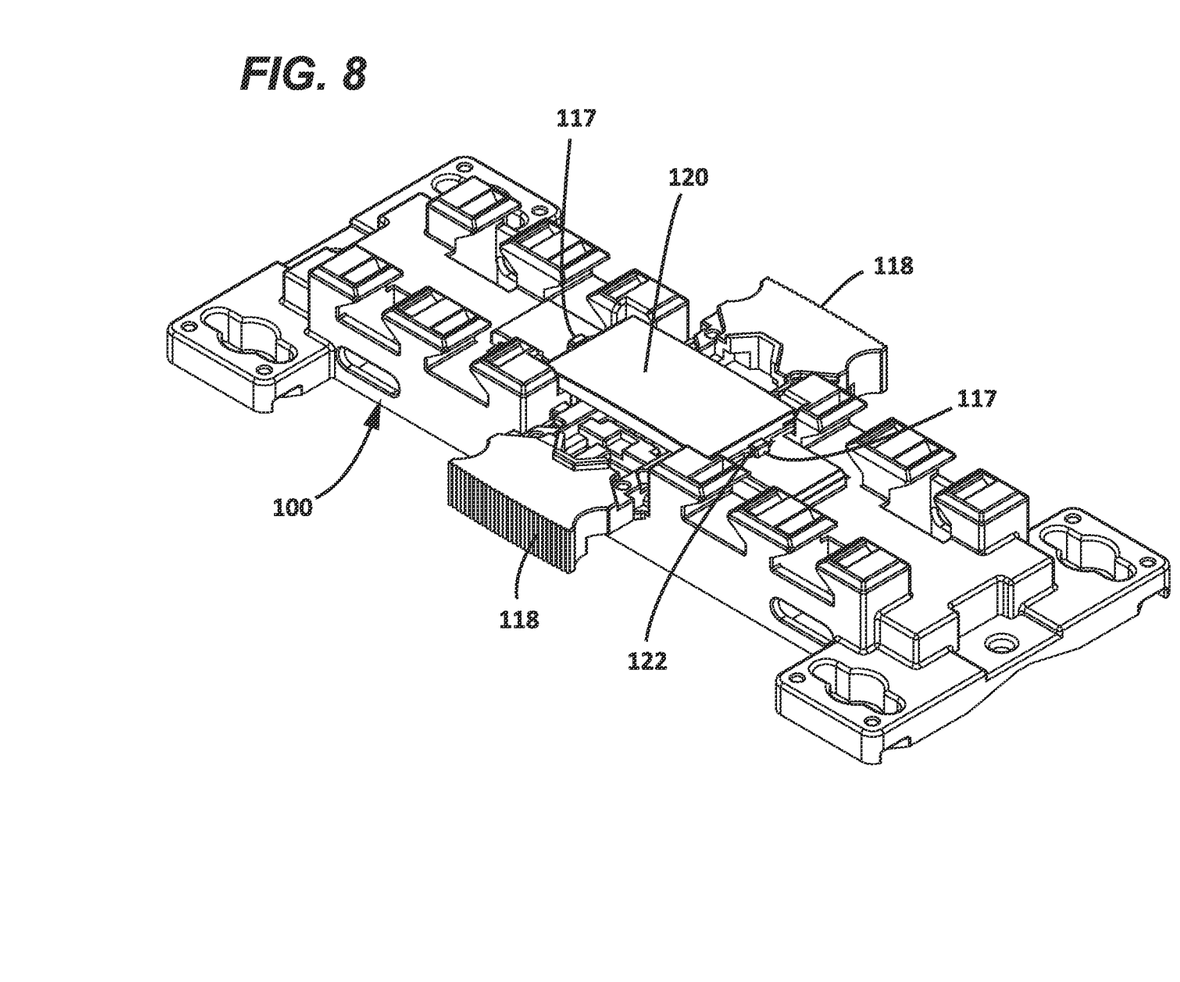
FIG. 8 is a front perspective view of the mounting bracket of FIG. 4 with the indicator member attached to the mounting bracket (e.g., over the securement arrangement)

FIG. 8 illustrates an example indicator member 120 mounted over the stop members 116 of an example mounting bracket 100. In some examples, the indicator member 120 is secured to the bracket 100 using the securement arrangement (e.g., the stop members 116). In such examples, the securement arrangement 115 is released (e.g., via actuators 118) to enable removal of the indicator member 120 from the mounting bracket 100. In other examples, the indicator member 120 is separately secured to the bracket 100 without the securement arrangement 115. For example, the indicator member 120 can be latched, friction-fit, or otherwise releasably attached to the mounting bracket 100 over a portion of the securement arrangement 115. In the example shown, tabs 122 of the indicator member 120 are snapped into hooks 117 at the front 101 of the bracket frame 102.

Examples of suitable indicator members 120 are described in PCT Publication No. WO 2019/191699, titled "Indicia and Method for Identifying Telecommunications Components," the disclosure of which is hereby incorporated by reference in its entirety.

Figure 9:
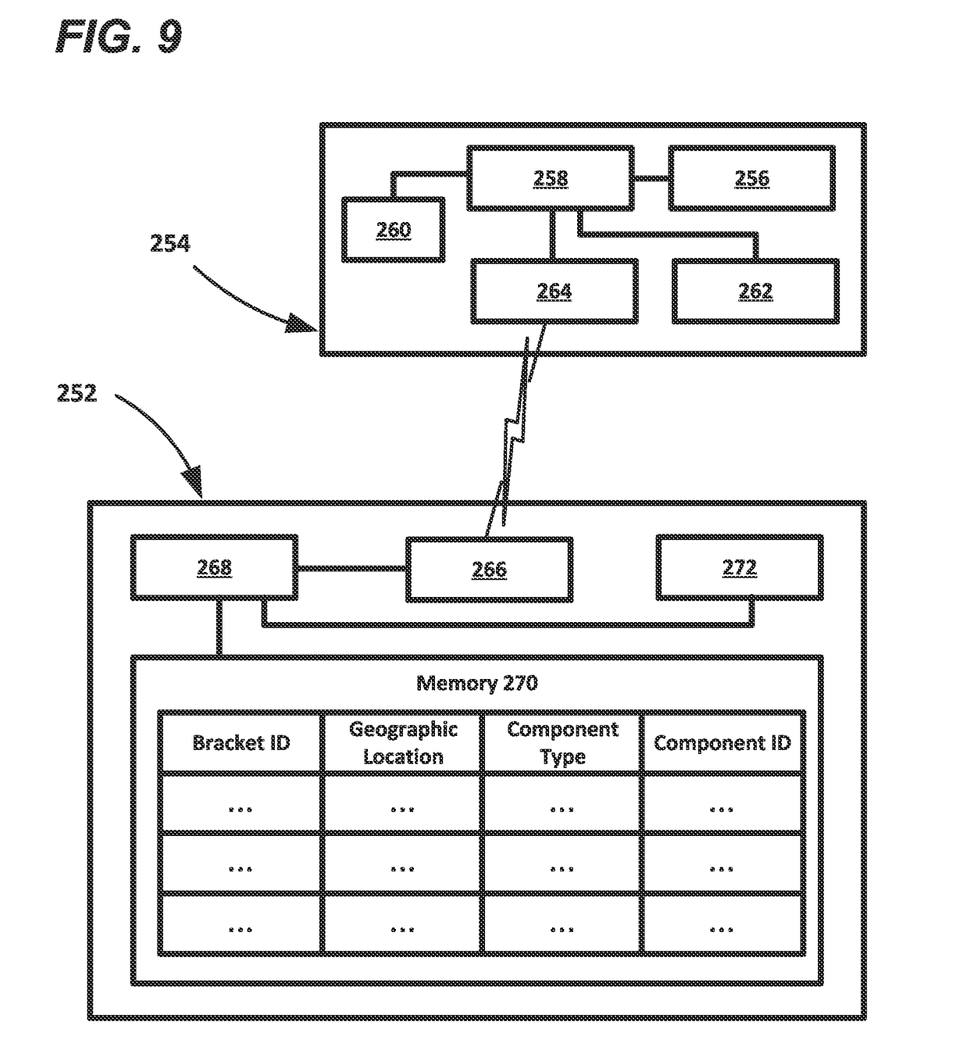
FIG. 9 is a schematic diagram of a data management system including a repository connected to one or more handheld devices to track deployment of the mounting brackets and/or components.
Figure 10:
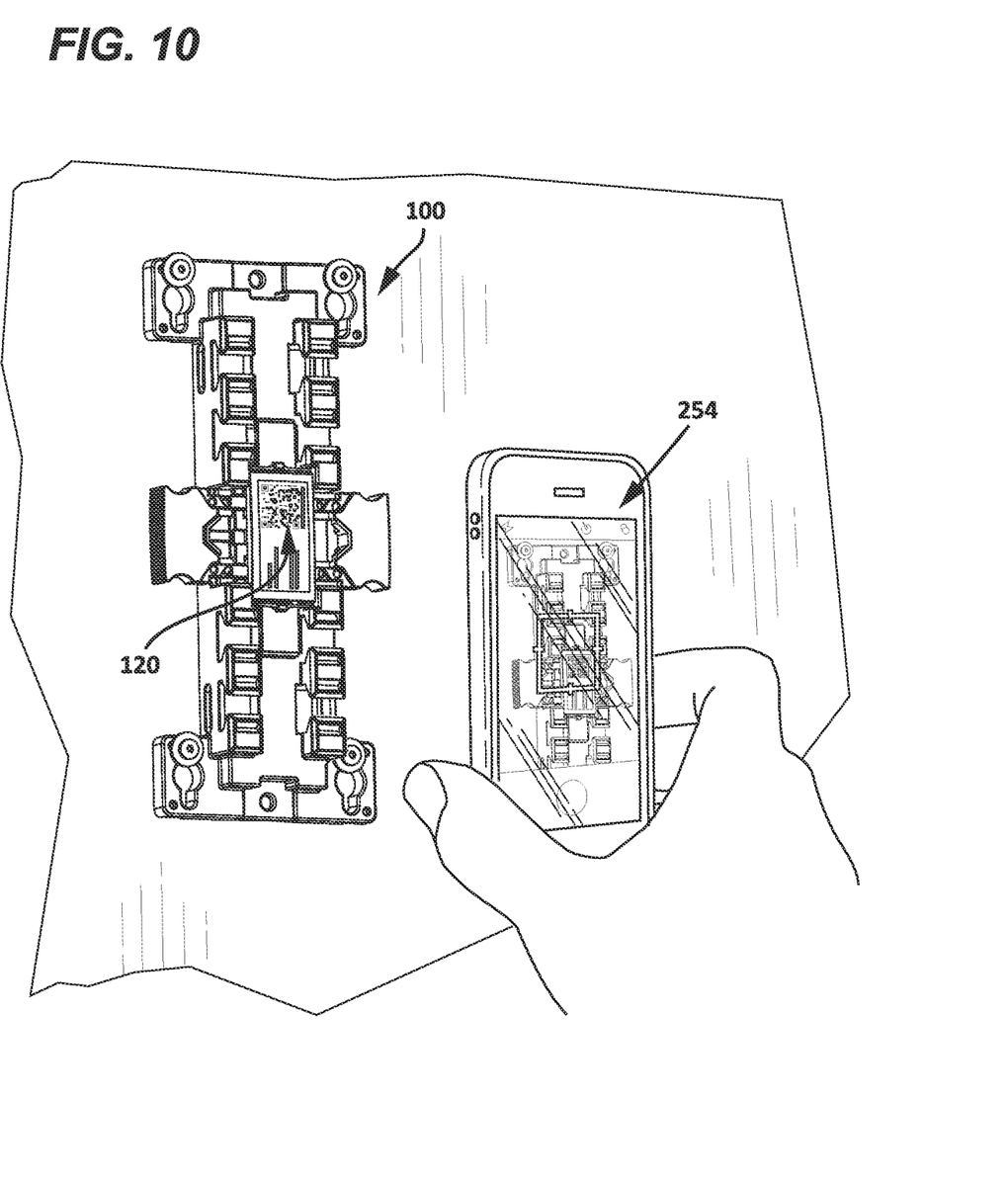
FIG. 10 is a perspective view of the mounting bracket of FIG. 1 showing a handheld device (e.g., a camera) obtaining indicia from (e.g., taking a photograph of) the bracket indicator member (e.g., prior to removing the indicator member from the bracket).

In accordance with certain aspects of the disclosure, the indicia provided by the indicator member 120 can be tracked using a data management system 250. FIG. 9 shows an example data management system 250 including a repository 252 (e.g., implemented by one or more electronic servers) and one or more handheld devices 254 that communicate with the repository 252. The handheld devices 254 are used to collect the bracket identifiers and other information in the field (e.g., see FIG. 10). The handheld devices 254 transmit or otherwise communicate the collected information to the repository 252.

Referring back to FIG. 2, the installation process 200 also may include obtaining indicia from the indicator member 120 at an obtain step 212. The obtain step 212 is performed before or immediately after the remove step 214. In some implementations, the obtain step 212 is performed during the reserve step 210 at the first date. Accordingly, the management system 250 learns the physical location of the mounting bracket 100 when the mounting bracket 100 is installed and, accordingly, the future location of a network component 150. In certain implementations, the obtain step 212 is performed at the second date (e.g., to confirm a match between the bracket indicator and a component indicator). In certain implementations, the obtain step 212 is performed multiple times-during the reserve step 210 and as part of the install step 216.

In some implementations, obtaining indicia at step 212 includes scanning the printed indicia on the indicator member 120 using one of the handheld devices 254 of the data management system 250. In an example, the printed indicia is obtained by taking a photograph with a mobile phone 254. In another example, the printed indicia is obtained with a different type of scanning tool (e.g., a laser scanner, a linear imager, a 2D area imager, etc.). In other implementations, obtaining indicia at step 212 includes reading electronic indicia using one of the handheld devices 254 of the data management system. For example, indicia electronically stored on a transceiver carried by the indicator member 120 may be read using an RFID reader 254. In still other implementations, some or all of the indicia can be manually input by a user via a user interface 262 of the handheld device 254 (e.g., via a custom application on a mobile phone).

In certain implementations, an example handheld device 254 includes a scanner or other type of reader 256 connected to a processor 258 and memory 260. Examples of suitable readers 256 include cameras, laser scanners, a linear imager, a 2D area imager, an electronic word processing application or electronic text editor, etc. The processor (e.g., a microprocessor) 256 controls the scanner/reader 256 to obtain the indicia (e.g., to take a picture, to scan a barcode/QR code, etc.) and to store the obtained indicia in the memory 260. In certain examples, the handheld device 254 also includes a user interface 262 coupled to the processor 258. The user interface 262 enables the user to activate the scanner/reader 256. In certain examples, the user interface 262 enables the user to enter additional information about the mounting bracket 100 and/or the installation site that is not already included on the indicator member 120. For example, a user may enter (e.g., using input buttons, touch screen, etc.) geographic information about where the installation site is located. In certain examples, the user interface 262 displays (e.g., via a display screen) some or all of the indicia obtained by the scanner/reader 256 to the user. The handheld device 254 also includes a communication interface 264 by which the handheld device 254 may communicate with the repository 252 (e.g., via a corresponding communications interface 266 of the repository 252). In some examples, the communications interfaces 264, 266 are configured to wireless communication (e.g., cellular, RFID, WI-FI, Bluetooth, Infrared communication, satellite communication, etc.). In other examples, the communications interfaces 264, 266 are configured for wired communication (e.g., to be directly or indirectly connected via one or more cables). In other examples, the communications interfaces 264, 266 are configured for both wired or wireless communication. In some examples, the handheld devices 254 communication directly with the repository 252. In other examples, the handheld devices 254 communication indirectly with the repository 252 (e.g., via the Internet or other network).

The repository 252 includes a processor 268 that manages the communication interface 266 to store the obtained information in memory 270. For example, the obtained information can be stored in one or more databases to manage the stored information. In certain implementations, for each mounting bracket 100, the memory 270 stores a bracket identification (e.g., bracket serial number) and a geographic location of the installation site at which the bracket 100 is disposed. In certain examples, the memory 270 also stores a listing of component types compatible with the mounting bracket 100 in association with the bracket identification. In the example shown, the memory 270 eventually stores a component identifier (e.g., a terminal serial number) that identifies the specific component 150 mounted at the bracket 100 during the installation step 216 of the installation process 200.

Having described the preferred aspects and implementations of the present disclosure, modifications and equivalents of the disclosed concepts may readily occur to one skilled in the art. However, it is intended that such modifications and equivalents be included within the scope of the claims which are appended hereto.

What is claimed is:

1. A method of installing a network comprising:
affixing a mounting bracket to a surface on a first date to reserve an installation site for a network component, the mounting bracket carries an indicator member bearing indicia identifying the mounting bracket;
mounting the network component to the mounting bracket at the installation site on a second date that is subsequent to the first date; and
removing the indicator member from the mounting bracket subsequent to the first date and prior to mounting the network component to the mounting bracket.

2. The method of claim 1, further comprising scanning the indicia to obtain an identification of the mounting bracket and storing the identification of the mounting bracket in electronic memory.

3. The method of claim 1, wherein removing the indicator member includes removing the indicator member from covering a securement arrangement of the mounting bracket; and wherein mounting the network component includes positioning the network component relative to the mounting bracket to engage the securement arrangement.

4. The method of claim 1, further comprising:
obtaining a geographic location of the surface to which the mounting bracket is affixed; and
storing the geographic location in electronic memory in association with the identification of the mounting bracket.

5. The method of claim 4, wherein the geographic location is manually entered by a user.

6. The method of claim 4, wherein the geographic location is automatically determined by a scanning device, preferably a smart phone or other handheld device.

7. The method of claim 1, wherein the indicator member is a first indicator member and the indicia is first indicia, and wherein the network component includes a second indicator member bearing second indicia, and wherein the method further comprises:
scanning the second indicia to obtain an identification of the network component; and
storing the identification of the network component in electronic memory in association with the identification of the mounting bracket.

8. The method of claim 7, further comprising storing the identification of the network component in association with the geographic location.

9. The method of claim 7, further comprising analyzing the identification of the network component and the identification of the mounting bracket to confirm a pre-assigned match between the network component and the mounting bracket.

10. The method of claim 1, wherein the first indicator member is installed on the network component when the network component is mounted to the mounting bracket, and wherein the indicator member is stored in memory in association with the network component.

11. A mounting bracket comprising:
a bracket frame having a rear and a front, the rear being configured to attach to a surface, the bracket frame including a securement arrangement accessible from the front; and an indicator member removably coupled to the front of the bracket frame, the indicator member bearing indicia identifying the mounting bracket, wherein the indicator member is disposed over the securement arrangement to block access to the securement arrangement from the front of the bracket frame.

12. The mounting bracket of claim 11, wherein the indicator member inhibits mounting a network component to the bracket frame while the indicator member is coupled to the front of the bracket frame.

13. The mounting bracket of claim 11, wherein the indicia includes print indicia.

14. The mounting bracket of claim 11, wherein the indicia includes electronically stored indicia.

15. The mounting bracket of claim 11, wherein the indicia identifies a listing of network components suitable for mounting to the bracket frame.

16. A system for installing a communications network at a plurality of installation sites, the system comprising:

a plurality of mounting brackets each configured to secure to a separate location, each mounting bracket including a respective indicator member that is removably coupled to the mounting bracket, each indicator member identifying the respective mounting bracket; and a plurality of network components, each network component being configured to mount to any of the mounting brackets only after the respective indicator member is removed.

17. The system of claim 16, wherein at least one of the network components includes a re-enterable enclosure.

18. The system of claim 16, wherein each of the network components is configured to receive the indicator member removed from the respective mounting bracket.

19. The system of claim 16, wherein each of the network components includes a respective indicator member identifying the network component.

* * * * *